(12) United States Patent
Cao et al.

(10) Patent No.: US 11,361,928 B2
(45) Date of Patent: Jun. 14, 2022

(54) PIEZOELECTRIC VACUUM TRANSISTOR

(71) Applicant: INTERNATIONAL BUSINESS MACHINES CORPORATION, Armonk, NY (US)

(72) Inventors: Qing Cao, Yorktown Heights, NY (US); Kangguo Cheng, Schenectady, NY (US); Zhengwen Li, Chicago, IL (US); Fei Liu, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 441 days.

(21) Appl. No.: 16/686,833

(22) Filed: Nov. 18, 2019

(65) Prior Publication Data

US 2020/0090896 A1 Mar. 19, 2020

Related U.S. Application Data

(63) Continuation of application No. 15/418,807, filed on Jan. 30, 2017, now Pat. No. 10,573,482.

(51) Int. Cl.
| | |
|---|---|
| *H01L 41/047* | (2006.01) |
| *H01J 21/08* | (2006.01) |
| *H01L 41/09* | (2006.01) |
| *H01L 41/29* | (2013.01) |
| *H01J 19/42* | (2006.01) |
| *H01J 9/39* | (2006.01) |
| *H01J 9/18* | (2006.01) |

(52) U.S. Cl.
CPC ............... *H01J 21/08* (2013.01); *H01J 9/18* (2013.01); *H01J 9/39* (2013.01); *H01J 19/42* (2013.01); *H01L 41/047* (2013.01); *H01L 41/0471* (2013.01); *H01L 41/0475* (2013.01); *H01L 41/094* (2013.01); *H01L 41/0933* (2013.01); *H01L 41/29* (2013.01)

(58) Field of Classification Search
CPC .. H01L 41/0471; H01L 41/0475; H01J 21/08; H01J 9/18
See application file for complete search history.

(56) References Cited

U.S. PATENT DOCUMENTS

| | | |
|---|---|---|
| 8,263,964 B2 | 9/2012 | Yu et al. |
| 8,405,279 B2 | 3/2013 | Elmegreen et al. |
| 8,928,228 B2 | 1/2015 | Cheatham, III et al. |
| 9,331,189 B2 | 5/2016 | Kim et al. |
| 9,431,205 B1 | 8/2016 | Briggs et al. |

(Continued)

OTHER PUBLICATIONS

List of IBM Patents or Patent Applications Treated as Related dated Nov. 18, 2019, 2 pages.

(Continued)

*Primary Examiner* — Bryan P Gordon
(74) *Attorney, Agent, or Firm* — Tutunjian & Bitetto, P.C.; Randall Bluestone

(57) ABSTRACT

A vacuum transistor includes a substrate and a first terminal formed on the substrate. A piezoelectric element has a second terminal formed on the piezoelectric element, wherein the piezoelectric element is provided over the first terminal to provide a gap between the first terminal and the second terminal. The gap is adjusted in accordance with an electrical field on the piezoelectric element.

20 Claims, 4 Drawing Sheets

A-A

(56) References Cited

U.S. PATENT DOCUMENTS

| | | | |
|---|---|---|---|
| 9,679,765 B2 | 6/2017 | Larson, III et al. | |
| 2009/0267166 A1* | 10/2009 | Verheijden | H02N 1/00 |
| | | | 438/51 |
| 2010/0019616 A1* | 1/2010 | Naruse | H02N 1/08 |
| | | | 310/300 |
| 2012/0194107 A1* | 8/2012 | Kandori | B06B 1/0246 |
| | | | 318/116 |
| 2015/0364669 A1* | 12/2015 | Rais-Zadeh | H01L 41/107 |
| | | | 257/76 |
| 2016/0276146 A1* | 9/2016 | Heath | H01T 4/12 |
| 2017/0155038 A1* | 6/2017 | Caraveo | B81C 1/0015 |

OTHER PUBLICATIONS

Eom, C-B et al., "Think-film piezoelectric MEMS" Materials Research Society (Nov. 2012) pp. 1007-1017, vol. 37.

Han, J-W et al., "Vacuum nanoelectronics: Back to the future?—Gate insulated nanoscale vacuum channel transistor" Applied Physics Letters (May 2012) pp. 213505-1-213505-4, vol. 100.

Hooker, M.W., "Properties of PZT-Based piezoelectric Ceramics between-150 and 250 C" NASA/CR-1998-208708 (Sep. 1998) pp. 1-28.

Ravariu, C., "Deeper Insights of the Conduction Mechanisms in a Vacuum SOI Nanotransistor" IEEE Transactions on Electron Devices (Aug. 2016) pp. 3278-3283, vol. 63, No. 8.

Srisonphan et al., "Metal-oxide-semiconductor field-effect transistor with a vacuum channel" Nature Nanotechnology (Jul. 2012) pp. 504-508, vol. 7, No. 8.

* cited by examiner

PIEZOELECTRIC VACUUM TRANSISTOR

BACKGROUND

Technical Field

The present invention generally relates to vacuum transistors, and more particularly to transistors having a piezoelectric material for adjusting a vacuum gap between source and drain regions.

Description of the Related Art

Vacuum transistors have properties that can be advantageous in many instances. Also referred to as vacuum-channel transistors, vacuum transistors can operate at higher speeds than ordinary silicon transistors and can be more tolerant of heat and radiation. Electrons propagate freely through a vacuum, whereas crystal-lattice scattering occurs in solid state channels. In addition, vacuum is not prone to the kind of radiation damage that plagues semiconductors, and produces less noise and distortion than solid-state materials.

However, unlike the conventional metal oxide semiconductor field effect transistors (MOSFETs), vacuum transistors rely on direct electron tunneling from emitter (E) to collector (C). In conventional vacuum transistors, a back gate is used to modulate the electric field between emitter and collector. The advantages of semiconductors, which include lower costs, smaller size, superior lifetime, efficiency, ruggedness, reliability, etc. have outweighed the use of vacuum transistors in many applications.

SUMMARY

In accordance with embodiments of the present invention, a vacuum transistor includes a substrate and a first terminal formed on the substrate. A piezoelectric element has a second terminal formed on the piezoelectric element, wherein the piezoelectric element is provided over the first terminal to provide a gap between the first terminal and the second terminal. The gap is adjusted in accordance with an electrical field on the piezoelectric element.

Another vacuum transistor in includes a substrate having a trench formed therein, a first terminal formed within the trench, a piezoelectric element and a second terminal formed on the piezoelectric element. The piezoelectric element is provided over the trench to provide a gap between the first terminal and the second terminal, the gap being adjusted in accordance with an electrical field on the piezoelectric element. Electrodes are formed on the piezoelectric element to generate the electrical field.

A method for fabricating a vacuum transistor includes forming a first terminal on a substrate; forming a second terminal on a piezoelectric element, wherein the piezoelectric element is provided over the first terminal to provide a gap between the first terminal and the second terminal; forming electrodes on the piezoelectric element such that the electrodes control a gap distance in accordance with an electrical field placed on the piezoelectric element; and evacuating the gap.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
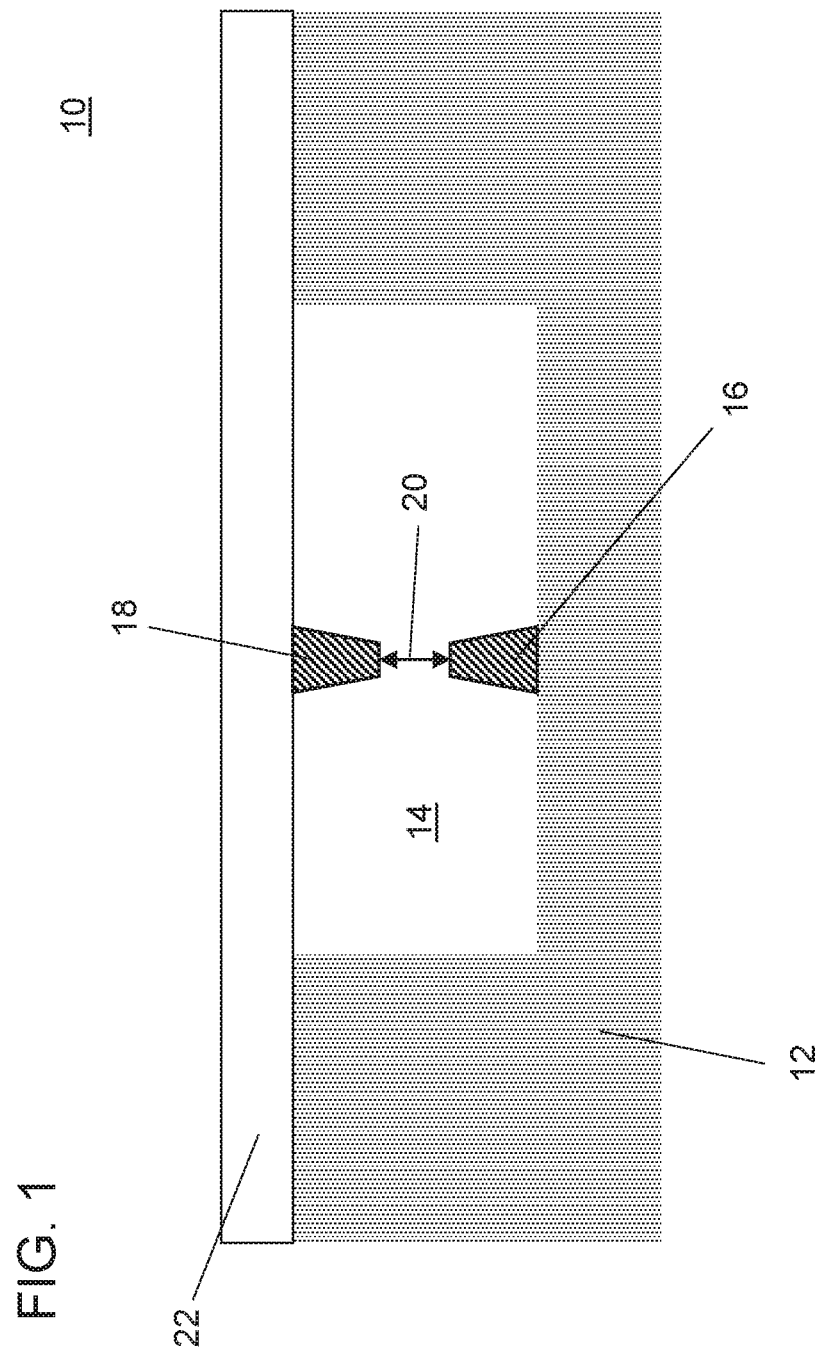
FIG. 1 is a cross-sectional view showing a vacuum transistor (or vacuum channel transistor) in accordance with an embodiment of the present invention.

In accordance with aspects of the present invention, vacuum transistors and methods for fabrication are provided. The vacuum transistors include an electric field adjustable terminal to control a tunnel distance between terminals of the device. In one embodiment, a first terminal (e.g., source) is connected to a piezoelectric material. A second terminal (e.g., drain) is fixed to a substrate. The tunnel distance between the source and drain is controlled by the piezoelectric material. A piezoelectric material is a material that expands or shrinks when it is subjected to an electric field. An elastic deformation of the piezoelectric material changes the distance between source and drain, thus changing a tunneling current.

The distance between source and drain can be maintained less than an average distance an electron travels before hitting a gas molecule (mean free path) to avoid collisions between electrons and gas molecules. For example, the mean free path of electrons in air under normal atmospheric pressure is about 200 nanometers, which increases under vacuum conditions. The smaller the gap, the chance of collision diminishes further.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a vacuum transistor device 10 is illustratively shown in accordance with one embodiment. The device 10 includes a substrate 12. The substrate 12 can include any suitable substrate structure, e.g., a bulk semiconductor, a semiconductor-on-insulator (SOI) substrate, etc. In one example, the substrate 12 can include a silicon-containing material. Illustrative examples of Si-containing materials suitable for the substrate 12 can include, but are not limited to, Si, SiGe, SiGeC, SiC, polysilicon, amorphous Si and multi-layers thereof. Although silicon is the predominantly used semiconductor material in wafer fabrication, alternative semiconductor materials can be employed, such as, but not limited to, germanium, gallium arsenide, gallium nitride, silicon germanium, cadmium telluride, zinc selenide, etc. In some embodiments, the substrate 12 can include an insulator, such as, e.g., an oxide, a nitride, glass, plastic, quartz, etc.

A trench or chamber 14 is formed in the substrate 12. The trench 14 can be etched into the substrate 12 using a pattern and etching process. The substrate 12 can include a wire or doped region for making contact with a terminal 16. Terminal 16 can be formed by depositing a material (e.g., a metal) on the substrate 12 and patterning the material to form the terminal 16. The terminal 16 can include any suitable conductive material, such as, e.g., copper, tungsten, titanium, gold, silver, platinum, etc. In one embodiment, terminal 16 forms a drain or collector.

A piezoelectric material or element 22 is formed or placed over the trench 14. The piezoelectric material 22 can include one or more of aluminum nitride, apatite, barium titanate, bismuth titanate, gallium phosphate, lanthanum gallium silicate, lead scandium tantalate, lead zirconate titanate (PZT), lithium tantalate, potassium sodium tartrate, quartz, sodium bismuth titanate, etc. In useful embodiments, piezoelectric material 22 can include, e.g., materials in the potassium niobate family, $KNbO_3$ or bismuth titanate family, $Bi_4Ti_3O_{12}$, $SiTi_4Bi_4O_{15}$, and $(Na_{0.5}Bi_{0.5})TiO_3)$. In one embodiment, piezoelectric material 22 has one or more terminals 18 formed thereon. Terminal 18 can be formed by depositing a material (e.g., a metal) on the piezoelectric material 22 and patterning the material to form the terminal 18. The terminal 18 can include any suitable conductive material, such as, e.g., copper, tungsten, titanium, gold, silver, platinum, etc. In one embodiment, terminal 18 forms a source or emitter. The piezoelectric material 22 and the substrate 12 can include wires, traces or metal lines (not shown) for making connections with the terminals 16, 18.

The piezoelectric material 22 can be formed as a beam, e.g., a rectangular beam, etc., although other structures or shapes may be employed. In some embodiments, the piezoelectric material 22 can have a necked down or hour glass central portion to provide enhanced flexure or other deflection responses.

The piezoelectric material 22 is placed over the trench 14 in a vacuum chamber to form a vacuum region in the trench 14 between the piezoelectric material 22 and the substrate 12. The piezoelectric material 22 can seal to the substrate 12 to maintain the vacuum seal. The piezoelectric material 22 can be bonded to the substrate 12 by an adhesive or by other methods such as filling the chamber first with a sacrificial material (e.g., amorphous carbon), depositing the piezoelectric material on top of the substrate 12 and the sacrificial material, opening an access trench by etching piezoelectric material (for example, the trench can be formed in the in-out paper direction), then removing the sacrificial material by etching it through the trench.

A tunnel distance 20 between terminal 16 and 18 (e.g., drain and source) is controlled by piezoelectric material 22. The piezoelectric material 22 expands or contracts when it is subjected to an electric field. The electric field can be applied to the piezoelectric material 22 using a conductive layer or layers applied to the piezoelectric material 22 (not shown). Elastic deformation of piezoelectric material 22 changes the tunnel distance 20 between the source and drain, thus changing tunneling current. The change in tunneling current can be employed to adjust the device performance or other characteristics of the device 10. In one embodiment, the piezoelectric material 22 can be implemented to turn the device on or off in accordance with the tunnel distance 20.

The tunnel distance or gap 20 is provided in a vacuum environment to reduce atoms or molecules between the terminals 16 and 18. The vacuum can be locally applied (e.g., within the trench 14) or may be globally applied on a higher level (e.g. chip or device-wide, e.g., the entire device or needed portions are under vacuum).

Figure 2:
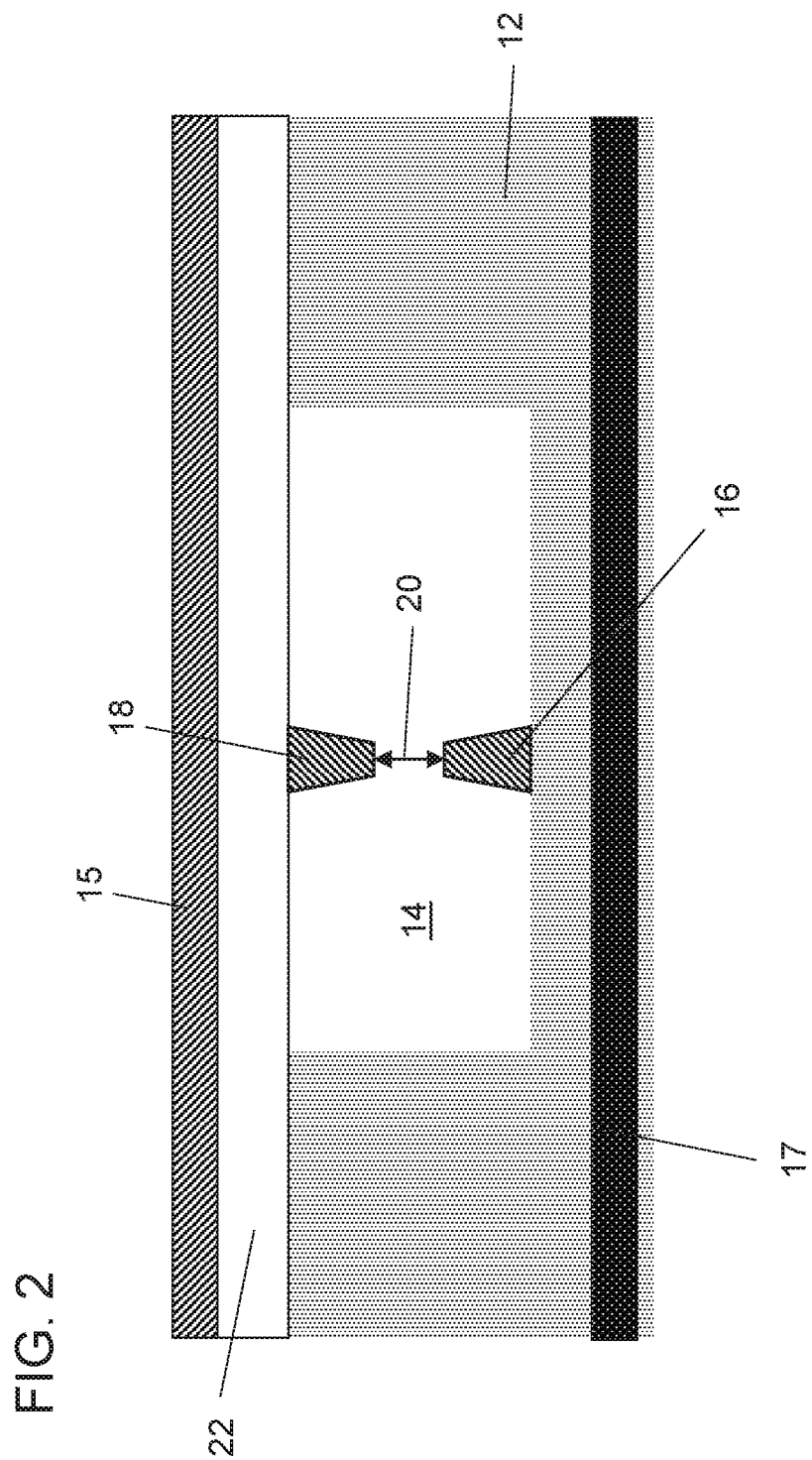
FIG. 2 is a cross-sectional view showing another vacuum transistor having plates for generating an electrical field in accordance with another embodiment of the present invention.

Referring to FIG. 2, in one embodiment, conductive plates 15 and 17 can be employed to generate an electric field. One plate 15 can be formed on the piezoelectric material or element 22. The other plate 17 can be formed within the substrate 12 (e.g., a doped region) or metal layer between layers on the substrate 12. The piezoelectric material 22 expands or contracts when it is subjected to the electric field. Elastic deformation of piezoelectric material 22 changes the tunnel distance 20 between the source 18 and drain 16, thus changing tunneling current. The change in tunneling current can be employed to adjust the device performance or other characteristics of the device 10. In one embodiment, the piezoelectric material 22 can be implemented to turn the device on or off in accordance with the tunnel distance 20. Other structures and techniques can be employed to generate an electric field for distorting the piezoelectric material 22.

Figure 3:
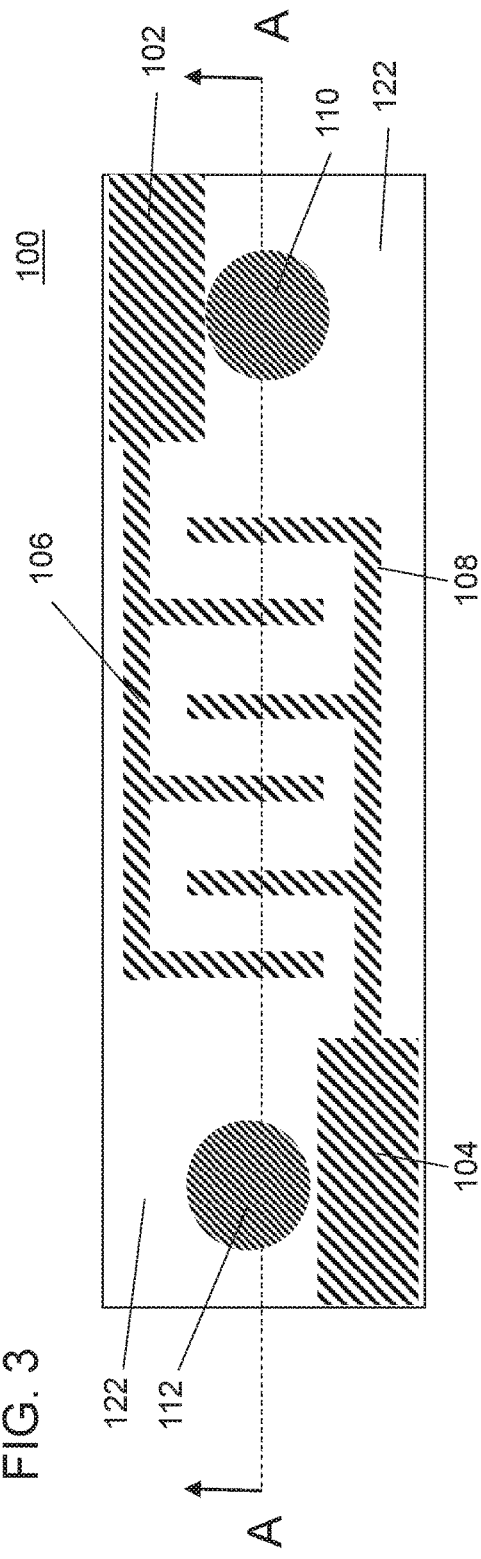
FIG. 3 is a top view showing metal patterns including interdigitated electrodes on a piezoelectric beam in accordance with another embodiment of the present invention.

Referring to FIG. 3, a top view of another vacuum transistor device 100 is illustratively shown in accordance with another embodiment. The device 100 includes a piezoelectric material 122 having interdigitated electrodes 102 and 104 formed thereon. The electrodes 102, 104 can be formed by depositing a metal layer on the piezoelectric material 122 and patterning the metal layer to form electrodes 102, 104. The electrodes 102, 104 include interdigitated portions 106 and 108 that can occupy a portion of a surface of the piezoelectric material 122 to permit a low voltage to be applied (e.g., between about 0.5 to about 1.5 volts) to generate an electric field that is large enough to produce meaningful change of distance between a source 110 and a drain 112.

Figure 4:
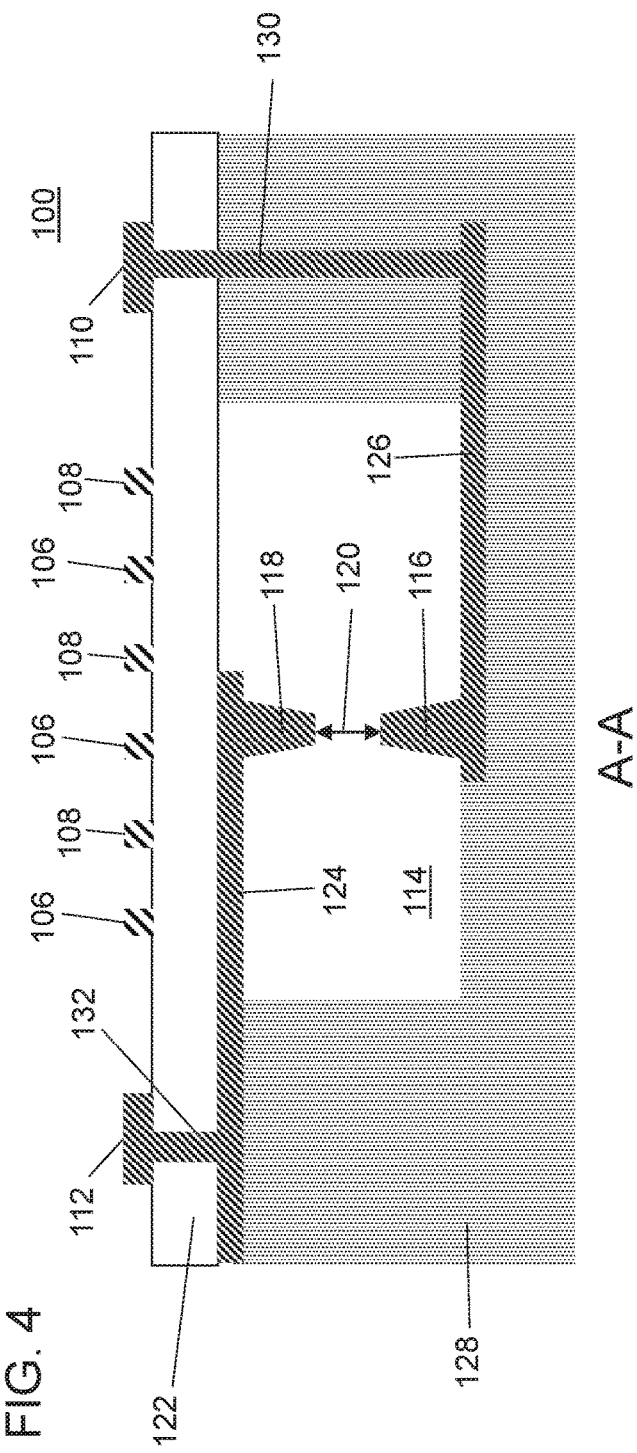
FIG. 4 is a cross-sectional view taken at section line A-A of FIG. 3 showing another vacuum transistor in accordance with another embodiment of the present invention.

Referring to FIG. 4, a cross-sectional view of the device 100 taken at section line A-A of FIG. 3 is illustratively shown. The substrate 128 can include any suitable substrate structure or material. A trench or chamber 114 is formed in the substrate 128. The trench 114 can be etched into the substrate 128 using a pattern and etching process. The substrate 128 can include a wire or doped region 126 for making contact with a terminal 116. Terminal 116 can be formed by depositing one or more layers of conductive material (e.g., metals) on the substrate 128 and patterning the material(s) to form the terminal 116. The terminal 116 can include any suitable conductive material, such as, e.g., copper, tungsten, titanium, gold, silver, platinum, etc. In one embodiment, terminal 116 forms a drain or collector.

The piezoelectric material 122 can include a wire or doped region 124 for making contact with a terminal 118. Terminal 118 can be formed by depositing one or more layers of conductive material (e.g., metals) on the piezoelectric material 122 and patterning the material(s) to form the terminal 118. The terminal 118 can include any suitable conductive material, such as, e.g., copper, tungsten, titanium, gold, silver, platinum, etc. In one embodiment, terminal 118 forms a source or emitter.

The piezoelectric material 122 is formed or placed over the trench 114. In one embodiment, piezoelectric material 122 has one or more terminals 118 formed thereon. Terminal 118 can be formed by depositing a material (e.g., a metal) on the piezoelectric material 122 and patterning the material to form the terminal 118 and the wire(s) or metal line(s) for making the connection 124 with the terminal 118.

A through via 132 passes through the piezoelectric material 122 and connects the line 124 with a source/drain electrode 112. A through via 130 passes through the piezoelectric material 122 and the substrate 128 to connect the line 126 with a source/drain electrode 110.

The piezoelectric material or plate 122 is placed over the trench 114 within a processing vacuum chamber to form a vacuum region in the trench 114 between the piezoelectric material 122 and the substrate 128. The piezoelectric material 122 seals to the substrate 112 to maintain the vacuum seal. The piezoelectric material 122 can be bonded to the substrate 128 by an adhesive or by other methods such as filling the chamber first with a sacrificial material (e.g., amorphous carbon), depositing the piezoelectric material on top of the substrate 12 and the sacrificial material, opening an access trench by etching piezoelectric material (for example, the trench can be formed in the in-out paper direction), then removing the sacrificial material by etching it through the trench.

The piezoelectric material 122 can include the listed materials. In useful embodiments, the piezoelectric material can include e.g., materials in the potassium niobate family, $KNbO_3$, or bismuth titanate family, $Bi_4Ti_3O_{12}$, $SrTi_4Bi_4O_{15}$, and $(Na_{0.5}Bi_{0.5})TiO_3$). These materials can be formed by any known techniques, such as deposition.

A tunnel distance 120 between terminal 116 and 118 (e.g., drain and source) is controlled by the piezoelectric material 122. The piezoelectric material 122 expands or contracts when it is subjected to an electric field. The electric field can be applied to the piezoelectric material 122 using electrodes 102, 104. Elastic deformation of piezoelectric material 122 changes the tunnel distance 120 between the source 118 and drain 116, thus changing tunneling current. The change in tunneling current can be employed to adjust the device performance or other characteristics of the device 100. In one embodiment, the piezoelectric material 122 can be implemented to turn the device on or off in accordance with the tunnel distance 120.

When voltage is applied between the interdigitated electrodes 102 and 104, the piezoelectric film 122 (e.g., PZT) develops an in-plane (horizontal) strain, which causes out-plane (vertical) strain of the PZT film 122. Since a source is mounted on the piezoelectric film 122, the gap 124 between source and drain terminals change, resulting tunneling current change (e.g., on/off of the vacuum transistor).

In accordance with illustrative embodiments, tunneling current I can be expressed as a function of the tunneling gap d as follows:

$$I(d) \propto \exp\left(\frac{-2\sqrt{2m-\Phi}}{\hbar}d\right)$$

where m is electron mass, $\Phi$ is the work function of the metal of the source 112 and drain 116, and $\hbar$ is reduced Planck constant $(1.054571800(13) \times 10^{-34}$ Joul sec).

For a work function $\Phi$ of 4 eV for a metal, the tunneling current I reduces by a factor 10 for every 0.1 nm increase in d. A distance of about ~1 nm between source 112 and drain 116 can be provided that is modified by an applied voltage between electrodes 102 and 104 to adjust the gap (d) 120 between source 112 and drain 116. For a piezoelectric material 122 including PZT, strain $\varepsilon_{33}=d_{33}*E_3$, where $E_3$ is the applied electric field on the PZT material and $d_{33}$ is a charge coefficient for PZT, which is between about 200× $10^{-12}$ m/V and about 600×$10^{-12}$ m/V but can be up to about 3000×$10^{-12}$ m/V with special treatments. Distortion or deflection $X_{33}=\varepsilon_{33}*L*N$, where a distance (L) between interdigitated electrodes 106, 108 can be on the order of nm to tens of nm. N is the number of pairs of interdigitated electrodes, which can be several to tens (e.g., 2-40 pairs). Then, $X_{33}$ for the beam formed by the piezoelectric material 122 can be computed in the electrical direction to adjust the gap 120. A voltage of about 1 V or less between electrodes 102 and 104 can control the on and off operation of the device 100.

In one illustrative embodiment, dimensions of components can be as follows. The gap 120 between source 118 and drain 116 can be approximately about 1 nm, although the gap distance can be tens of nm to even microns. The distance (L) or gap between interdigitated electrodes 106, 108 can be between about a 1 nm to tens of nm's. The number of pairs (N) of interdigitated electrodes 106, 108 can be several to tens of pairs. A thickness of piezoelectric film 122 can be between about 1 nm to hundreds of nm's. A width of the piezoelectric film 122 can be about 10 nm to about 1 micron or more. A height of the S/D electrodes 118 and 116 can be about 1 nm to tens of nm's. The dimensions described are illustrative and non-limiting. Other dimensions and structures may also be employed.

Figure 5:
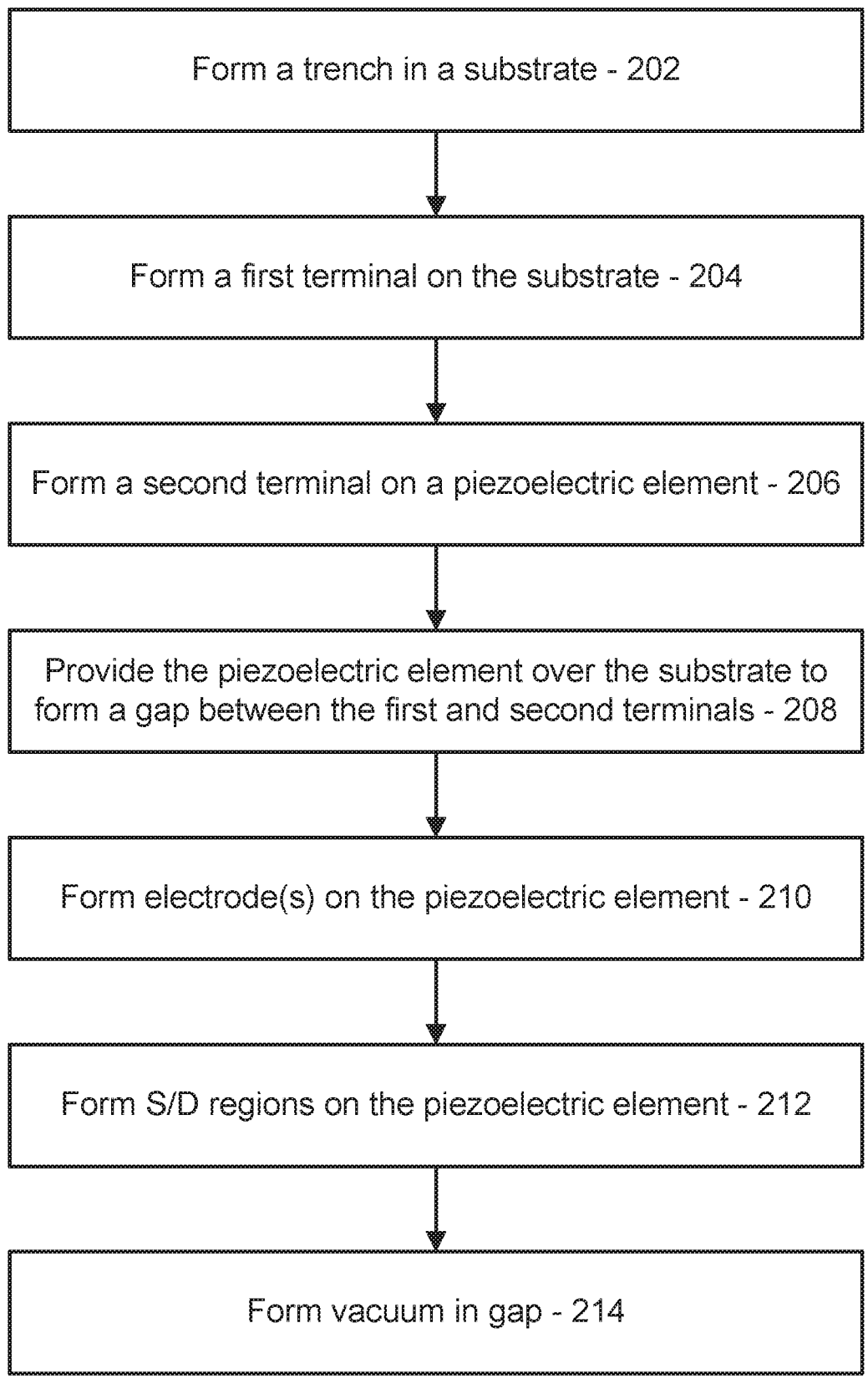
FIG. 5 is a block/flow diagram showing methods for forming a vacuum transistor in accordance with embodiments of the present invention.

Referring to FIG. 5, methods for fabricating vacuum transistors are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 202, a substrate can be processed to form a trench. Lithographic or other patterning techniques can be employed to etch a trench in accordance with an etch mask. In block 204, a first terminal is formed on the substrate. The first terminal can be formed by depositing a metal or other conductive material on the substrate. Any suitable deposition process may be employed, e.g., chemical vapor deposition (CVD), sputtering, etc. The metal layer can then be patterned using, e.g., lithographic or other patterning techniques and etching in accordance with a patterned etch mask. In some embodiments, electrical connections to the first terminal can be formed concurrently or previously.

In block 206, a second terminal is formed on a piezoelectric element. The second terminal can be formed by depositing a metal or other conductive material on the piezoelectric element. Any suitable deposition process may be employed, e.g., chemical vapor deposition (CVD), sputtering, etc. The metal layer can then be patterned using, e.g., lithographic or other patterning techniques and etching in accordance with a patterned etch mask. In some embodiments, electrical connections to the second terminal can be formed concurrently on the piezoelectric element. Metal patterns can be formed on one or both sides of the piezoelectric element, e.g., on a side opposite the second terminal to form flexing electrodes, terminals or other structures and on a same side of the second terminal for a connection to the second terminal, etc.

In block 208, the piezoelectric element is provided over the first terminal to provide a gap between the first terminal and the second terminal. The gap can be set at an initial distance to permit on/off switching of the transistor in accordance with the electrical field. The piezoelectric element can be a cover to close off the trench or the trench may remain open to a larger region which is evacuated. The piezoelectric element can be bonded in place or otherwise secured and, in some embodiments, hermetically sealed over the trench. The piezoelectric element can include a beam element or other structure element or shape that distorts in a desired way to adjust the gap when the electrical field is applied. The piezoelectric element can be bonded to the substrate by an adhesive or by other methods such as filling the chamber first with a sacrificial material (e.g., amorphous carbon), depositing the piezoelectric element on top of the substrate and the sacrificial material, opening an access trench by etching piezoelectric material (for example, the trench can be formed through the sides of the trench/ substrate), then removing the sacrificial material by etching it through the trench.

In block 210, electrodes can be formed on the piezoelectric element such that the electrodes can control a gap distance in accordance with an electrical field placed on the electrodes. The electrodes can be formed by depositing a metal or other conductive material on the piezoelectric element (backside opposite the second terminal). Any suitable deposition process may be employed, e.g., chemical vapor deposition (CVD), sputtering, etc. The metal layer can then be patterned using, e.g., lithographic or other patterning techniques and etching in accordance with a patterned etch mask. The electrodes can be formed in any number of patterns including, e.g., interdigitated, serpentine, parallel lines, zig zag lines, etc.

In block 212, source and drain (S/D) regions or electrodes are formed as well as vertical, horizontal and other electrical connections to the first and second terminals. Any suitable deposition process may be employed, e.g., chemical vapor deposition (CVD), sputtering, etc. The metal layer can then be patterned using, e.g., lithographic or other patterning techniques and etching in accordance with a patterned etch mask. The source and drain regions or electrodes can be formed on and through the piezoelectric element.

In block 214, the gap, the region around the gap or the entire device is evacuated to form a vacuum. The vacuum includes at least a pressure lower than atmospheric pressure, and more preferably less than a 1-50 Torr. In some embodiments, the evacuation may be achieved during any of the processing steps. For example, vacuum can be achieved by putting the structure in a process chamber with low pressure or vacuum to extract any gas/air out, followed by a directional deposition to seal the ends of the tunneling chamber. Processing can continue to complete the device.

Having described preferred embodiments for piezoelectric vacuum transistors and methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A vacuum transistor, comprising:
a substrate with a chamber in the substrate;
a first doped region in the substrate below the chamber;
a first terminal formed on the first doped region;
a piezoelectric material on the substrate and above the chamber, wherein the piezoelectric material includes a second doped region; and
a second terminal on the second doped region, wherein the second terminal is aligned with the first terminal, and wherein there is a gap with a distance between the first terminal and the second terminal.

2. The vacuum transistor as recited in claim 1, further comprising a first electrode and a second electrode on a side of the piezoelectric material opposite from the second terminal.

3. The vacuum transistor as recited in claim 2, wherein the first electrode and the second electrode each include interdigitated portions on the piezoelectric material.

4. The vacuum transistor as recited in claim 3, wherein the first electrode and the second electrode are configured to generate an electric field that causes the piezoelectric material to expand or contract.

5. The vacuum transistor as recited in claim 4, wherein the piezoelectric material and chamber are configured to change the distance between the first terminal and the second terminal.

6. The vacuum transistor as recited in claim 5, wherein a tunneling current between the first terminal and the second terminal is a function of the gap distance.

7. The vacuum transistor as recited in claim 5, wherein the first terminal and the second terminal are each made of a metal selected from the group consisting of copper, tungsten, titanium, gold, silver, and platinum.

8. The vacuum transistor as recited in claim 5, further comprising a source/drain electrode electrically connected to the second doped region.

9. A vacuum transistor, comprising:
a substrate with a trench in the substrate;
a first wire in the substrate below the trench;
a first terminal formed in electrical contact with the first wire;
a piezoelectric material on the substrate and above the trench, wherein the piezoelectric material includes a second wire, and wherein the piezoelectric material forms a vacuum seal with the substrate to maintain a vacuum region in the trench; and
a second terminal in electrical contact with the second wire, wherein the second terminal is aligned with the first terminal, and wherein there is a gap with a distance between the first terminal and the second terminal.

10. The vacuum transistor as recited in claim 9, further comprising a first electrode and a second electrode on a side of the piezoelectric material opposite from the second electrode.

11. The vacuum transistor as recited in claim 10, wherein the first electrode and the second electrode each include interdigitated portions on the piezoelectric material.

12. The vacuum transistor as recited in claim 11, wherein the first electrode and the second electrode are configured to generate an electric field that causes the piezoelectric material to expand or contract.

13. The vacuum transistor as recited in claim 12, wherein the piezoelectric material and trench are configured to change the distance between the first terminal and the second terminal.

14. The vacuum transistor as recited in claim 13, wherein a tunneling current between the first terminal and the second terminal is a function of the gap distance.

15. The vacuum transistor as recited in claim 13, wherein the first terminal and the second terminal are each made of a metal selected from the group consisting of copper, tungsten, titanium, gold, silver, and platinum.

16. The vacuum transistor as recited in claim 13, further comprising a source/drain electrode electrically connected to the second wire, wherein the source/drain electrode is on the same side of the piezoelectric material as the first electrode and the second electrode.

17. A vacuum transistor, comprising:
a substrate with a chamber in the substrate;
a first doped region in the substrate below the chamber;
a first terminal formed on the first doped region;
a piezoelectric material on the substrate and above the chamber, wherein the piezoelectric material includes a second doped region, and wherein the piezoelectric material forms a vacuum seal with the substrate to maintain a vacuum region in the chamber;

a second terminal on the second doped region, wherein the second terminal is aligned with the first terminal, and wherein there is a gap with a distance between the first terminal and the second terminal; and a first electrode and a second electrode on a side of the piezoelectric material opposite from the second terminal, wherein the first electrode and the second electrode each include interdigitated portions on the piezoelectric material.

18. The vacuum transistor as recited in claim 17, wherein the first terminal and the second terminal are each made of a metal selected from the group consisting of copper, tungsten, titanium, gold, silver, and platinum.

19. The vacuum transistor as recited in claim 17, wherein the first electrode and the second electrode are configured to generate an electric field that causes the piezoelectric material to expand or contract.

20. The vacuum transistor as recited in claim 17, wherein the piezoelectric material is selected from the group consisting of potassium niobate $KNbO_3$, bismuth titanate $Bi_4Ti_3O_{12}$, $SrTi_4Bi_4O_{15}$, and $(Na_{0.5}Bi_{0.5})TiO_3$.

* * * * *